United States Patent
Pecile

(10) Patent No.: US 7,635,983 B2
(45) Date of Patent: Dec. 22, 2009

(54) BATTERY TESTING APPARATUS THAT CONTROLS A SWITCH TO ALLOW CURRENT TO FLOW FROM THE BATTERY TO A UTILITY POWER SOURCE

(75) Inventor: Conrad Angelo Pecile, Hellertown, PA (US)

(73) Assignee: Myers Power Products, Inc., Bethlehem, PA (US)

( * ) Notice: Subject to any disclaimer, the term of this patent is extended or adjusted under 35 U.S.C. 154(b) by 320 days.

(21) Appl. No.: 11/651,038

(22) Filed: Jan. 9, 2007

(65) Prior Publication Data

US 2008/0164762 A1     Jul. 10, 2008

(51) Int. Cl.
*G01N 27/416* (2006.01)
(52) U.S. Cl. .................................................. 324/426
(58) Field of Classification Search .............. 324/426, 324/427, 433; 320/106, 110, 116, 132, 149; 307/64, 65, 66
See application file for complete search history.

(56) References Cited

U.S. PATENT DOCUMENTS

| | | | |
|---|---|---|---|
| 6,172,432 B1 * | 1/2001 | Schnackenberg et al. | 307/23 |
| 6,204,645 B1 * | 3/2001 | Cullen | 323/223 |
| 6,526,361 B1 | 2/2003 | Jones et al. | |
| 6,983,212 B2 | 1/2006 | Burns | |
| 6,992,487 B1 | 1/2006 | Steinke | |
| 2005/0007074 A1 | 1/2005 | Koster et al. | |
| 2005/0184593 A1 | 8/2005 | Gottlieb et al. | |
| 2006/0038572 A1 | 2/2006 | Philbrook | |

\* cited by examiner

*Primary Examiner*—Edward Tso
(74) *Attorney, Agent, or Firm*—Wenderoth, Lind & Ponack, L.L.P.

(57) ABSTRACT

A battery testing apparatus including battery charger/tester and a controller having battery charge mode and a battery test mode. In the battery charge mode, the controller causes a utility power source to be connected to the battery charger/tester, and the battery charger/tester allows electrical current to flow from the utility power source to the battery. In the battery test mode, the battery charger/tester allows current to flow to the utility power source so as to provide a consistently repeatable power draw from the battery reducing the error in detection of a weakened battery.

15 Claims, 17 Drawing Sheets

ON LINE (DOUBLE CONVERSION) UPS-AC LOAD
BATTERY TESTING MODE

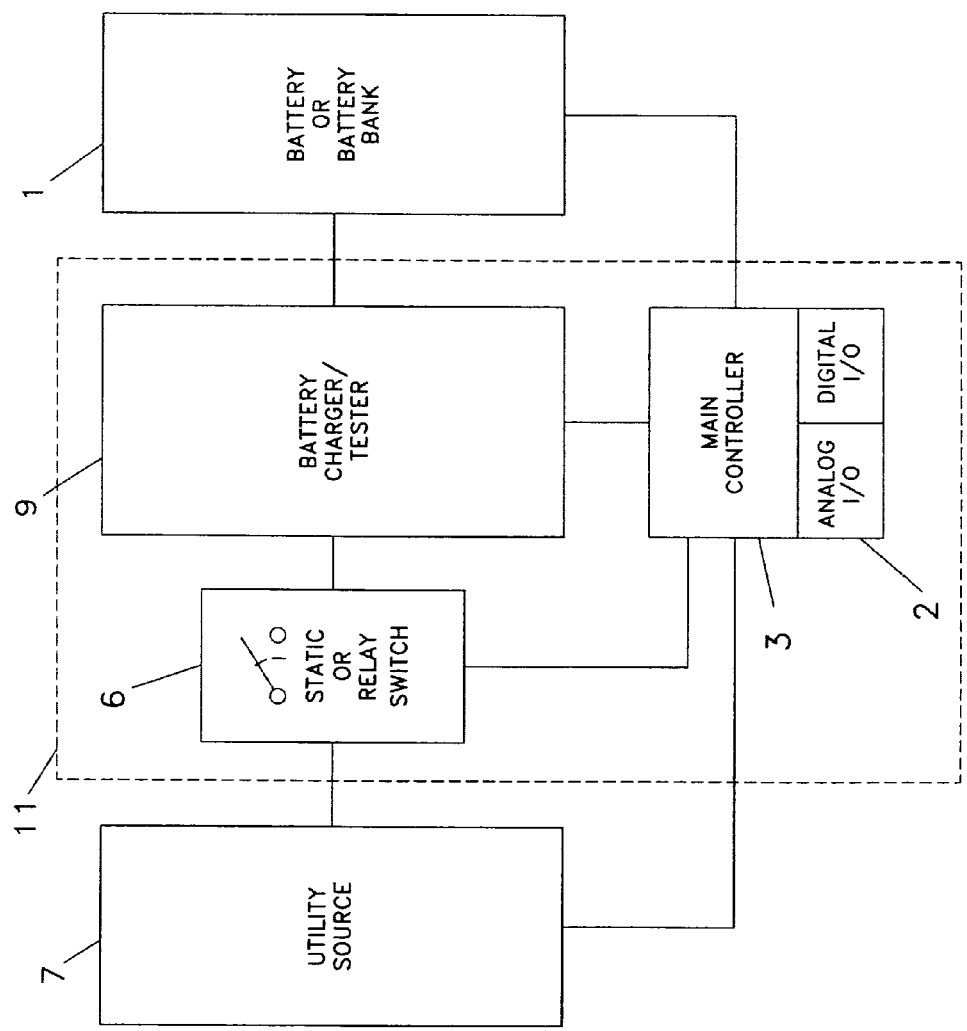
FIGURE 1A BATTERY CHARGER/TESTER

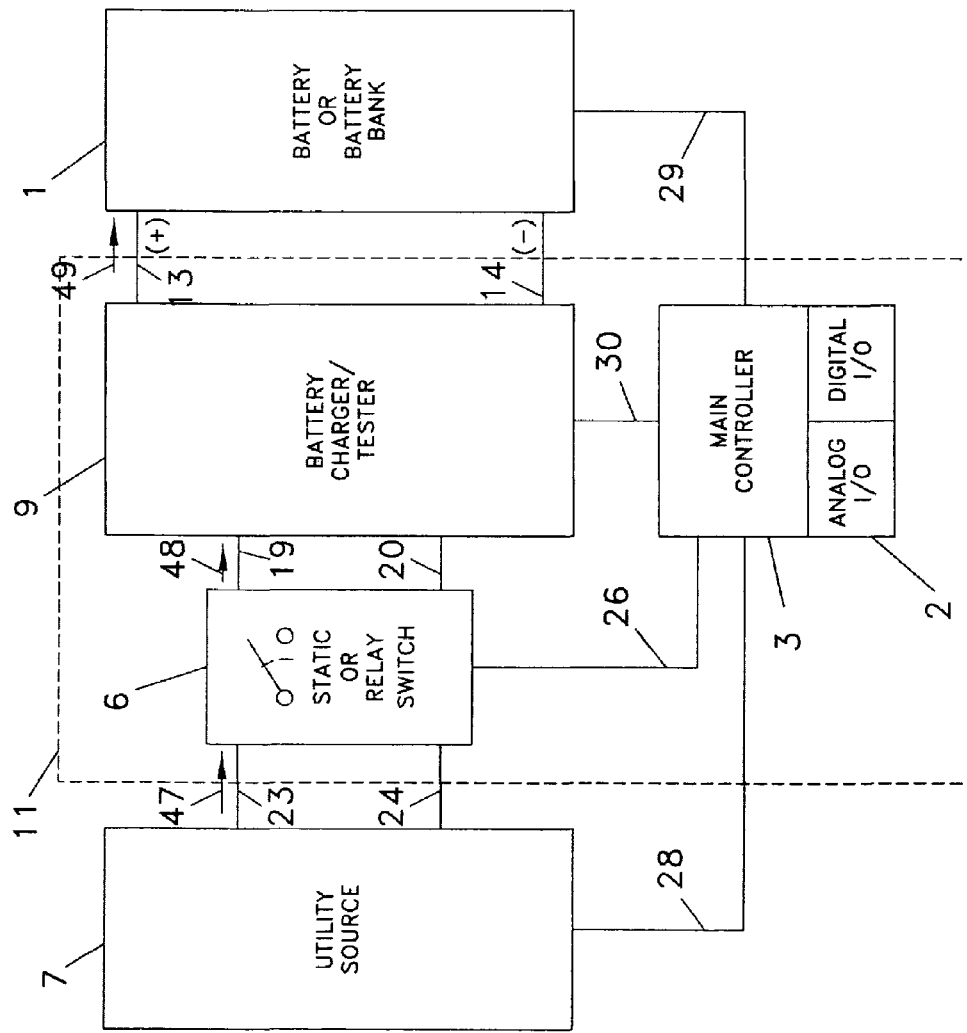
FIGURE 1B BATTERY CHARGER/TESTER-BATTERY CHARGING MODE

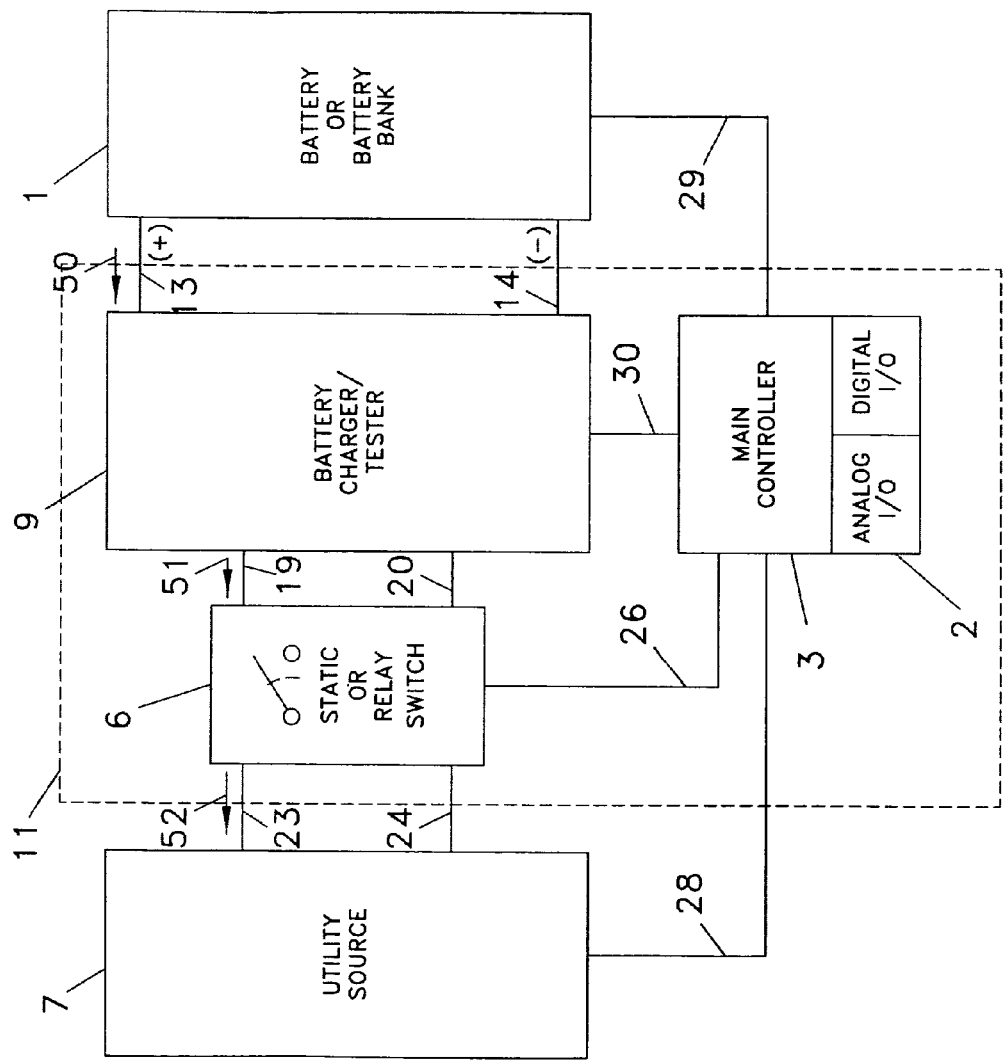
FIGURE 1C BATTERY CHARGER/TESTER-BATTERY TESTING MODE

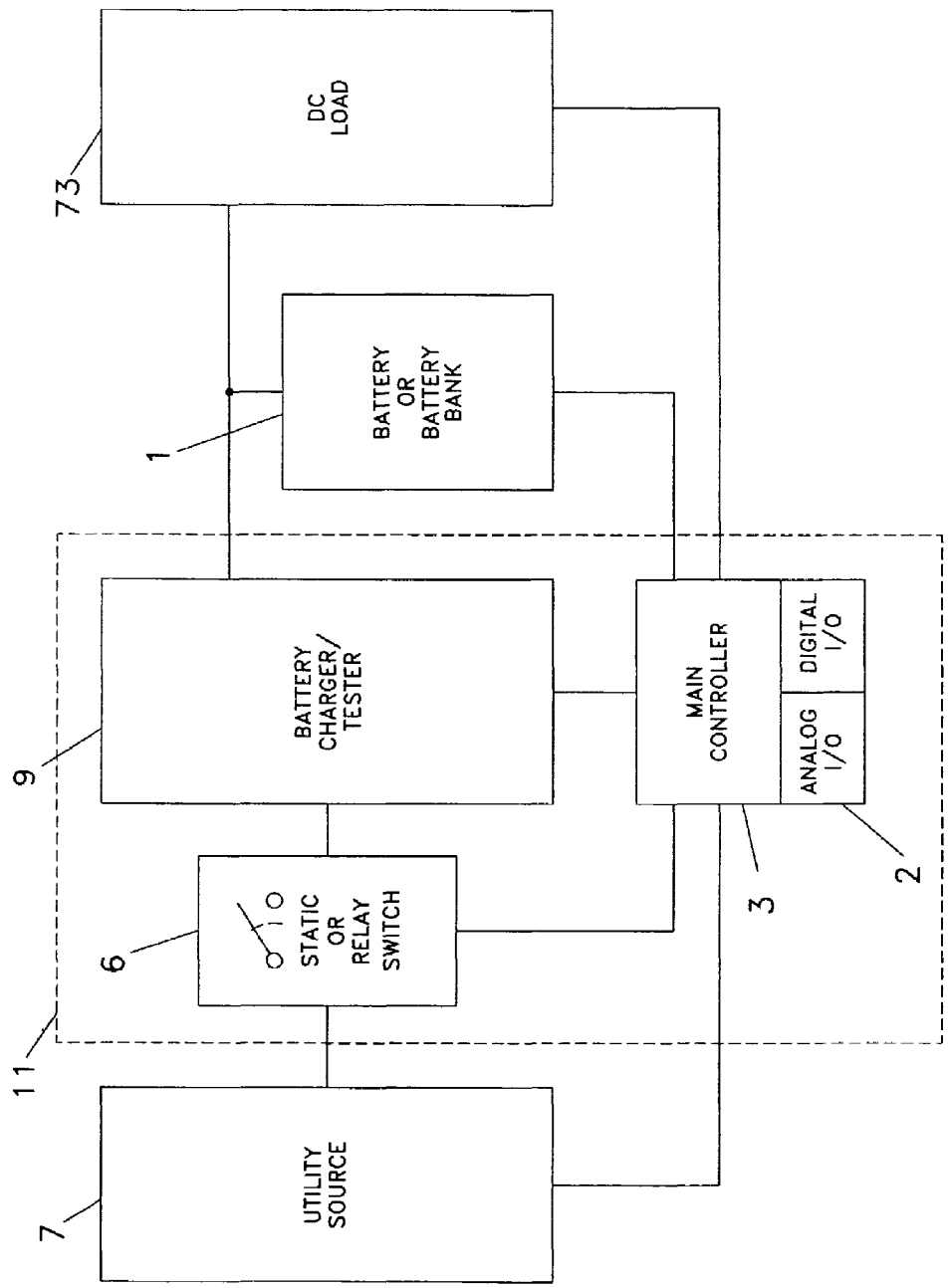
FIGURE 2A DC LOAD UPS

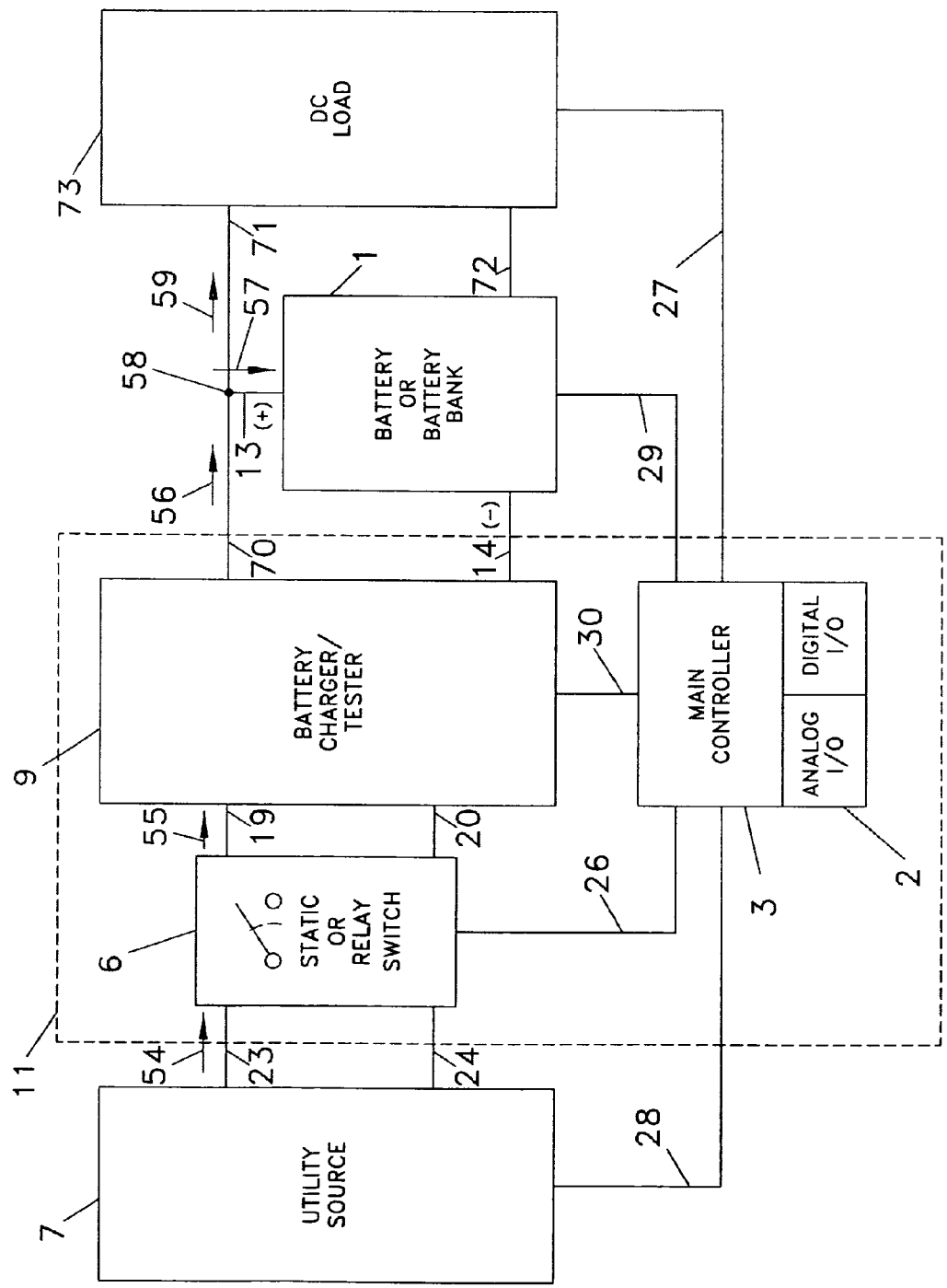
FIGURE 2B DC LOAD UPS-BATTERY CHARGING MODE

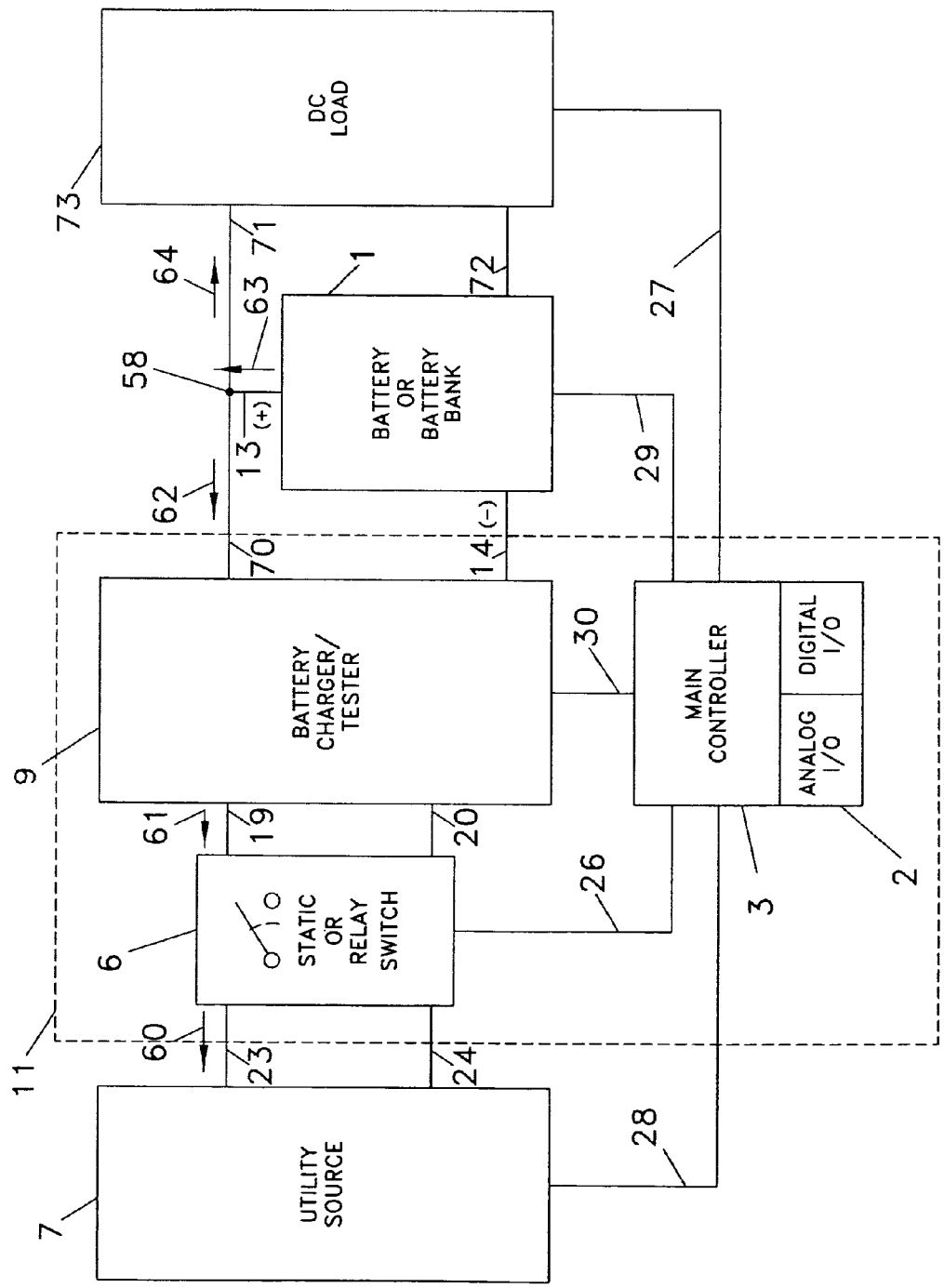
FIGURE 2C DC LOAD UPS-BATTERY TESTING MODE

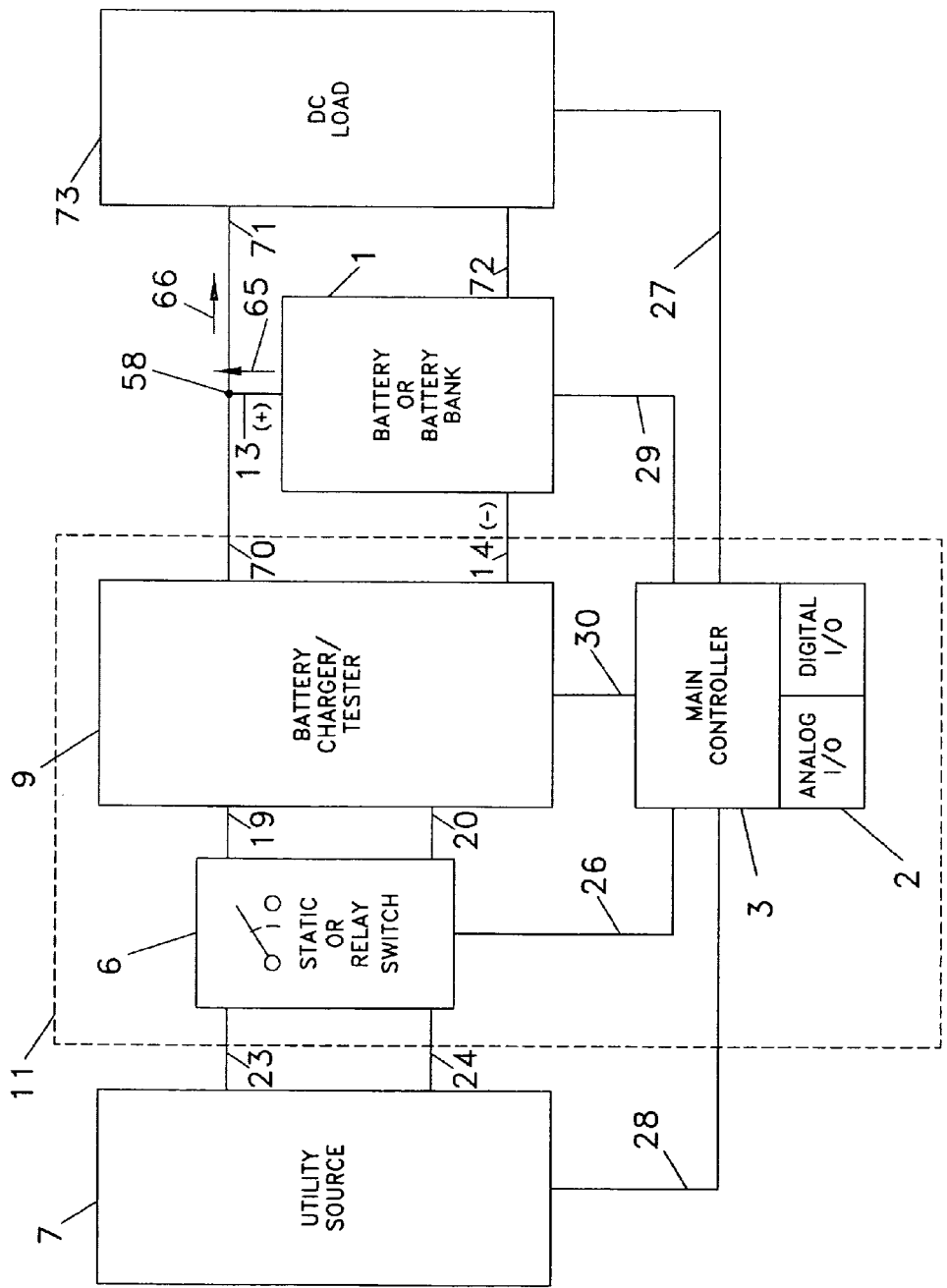
FIGURE 2D DC LOAD UPS-BATTERY BACKUP MODE

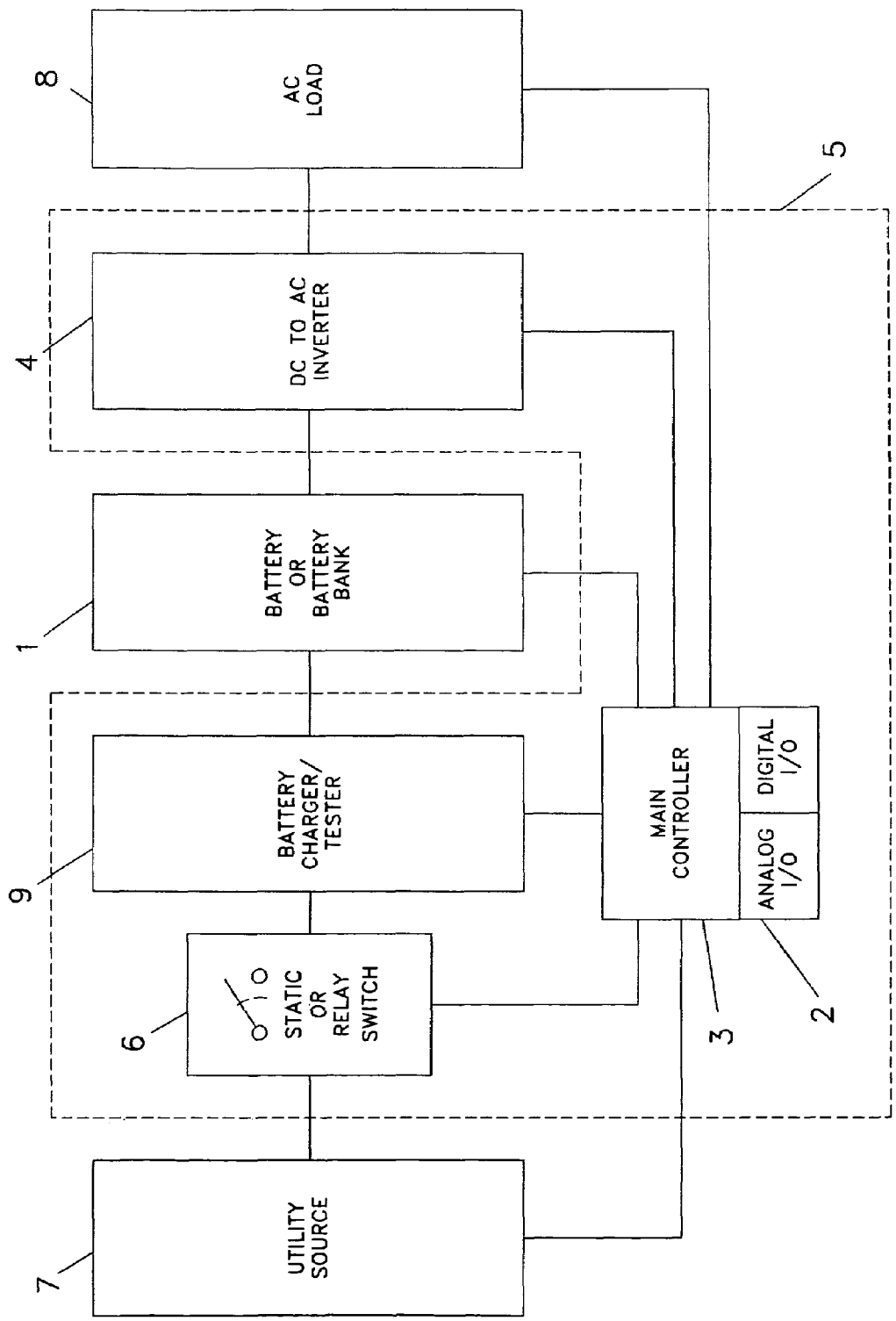
FIGURE 3A ON LINE (DOUBLE CONVERSION) UPS-AC LOAD

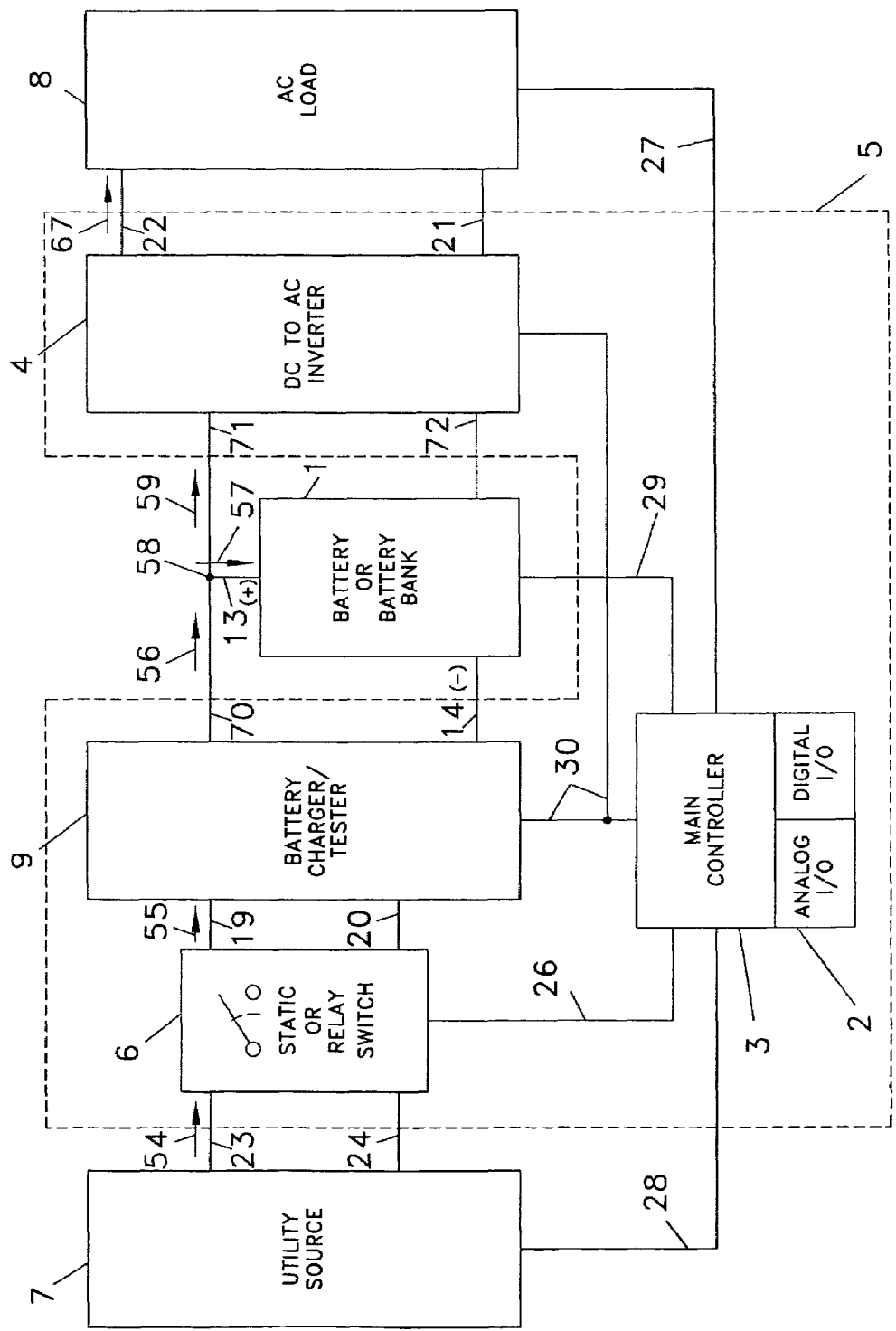
FIGURE 3B ON LINE (DOUBLE CONVERSION) UPS—AC LOAD BATTERY CHARGING MODE

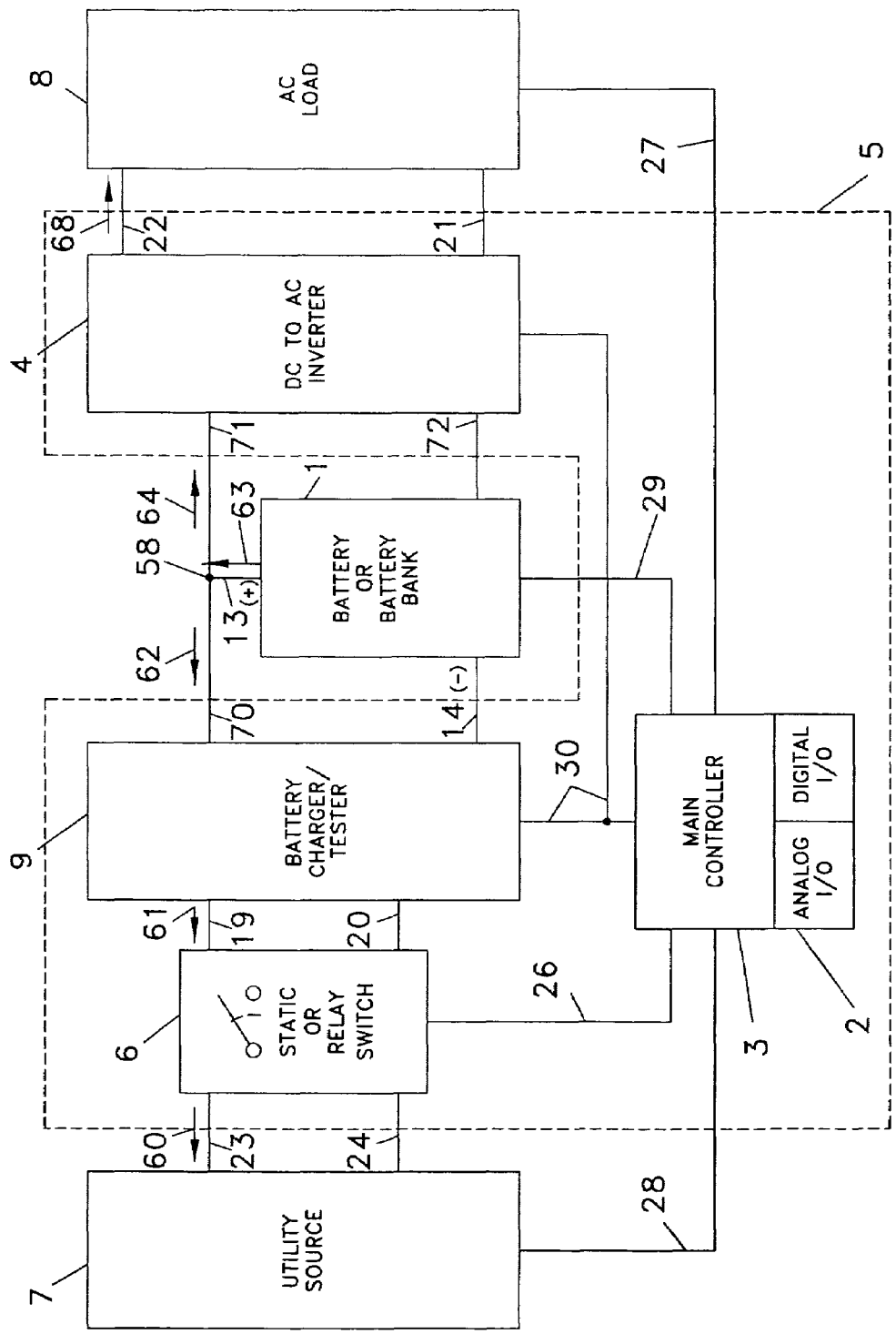
FIGURE 3C ON LINE (DOUBLE CONVERSION) UPS-AC LOAD BATTERY TESTING MODE

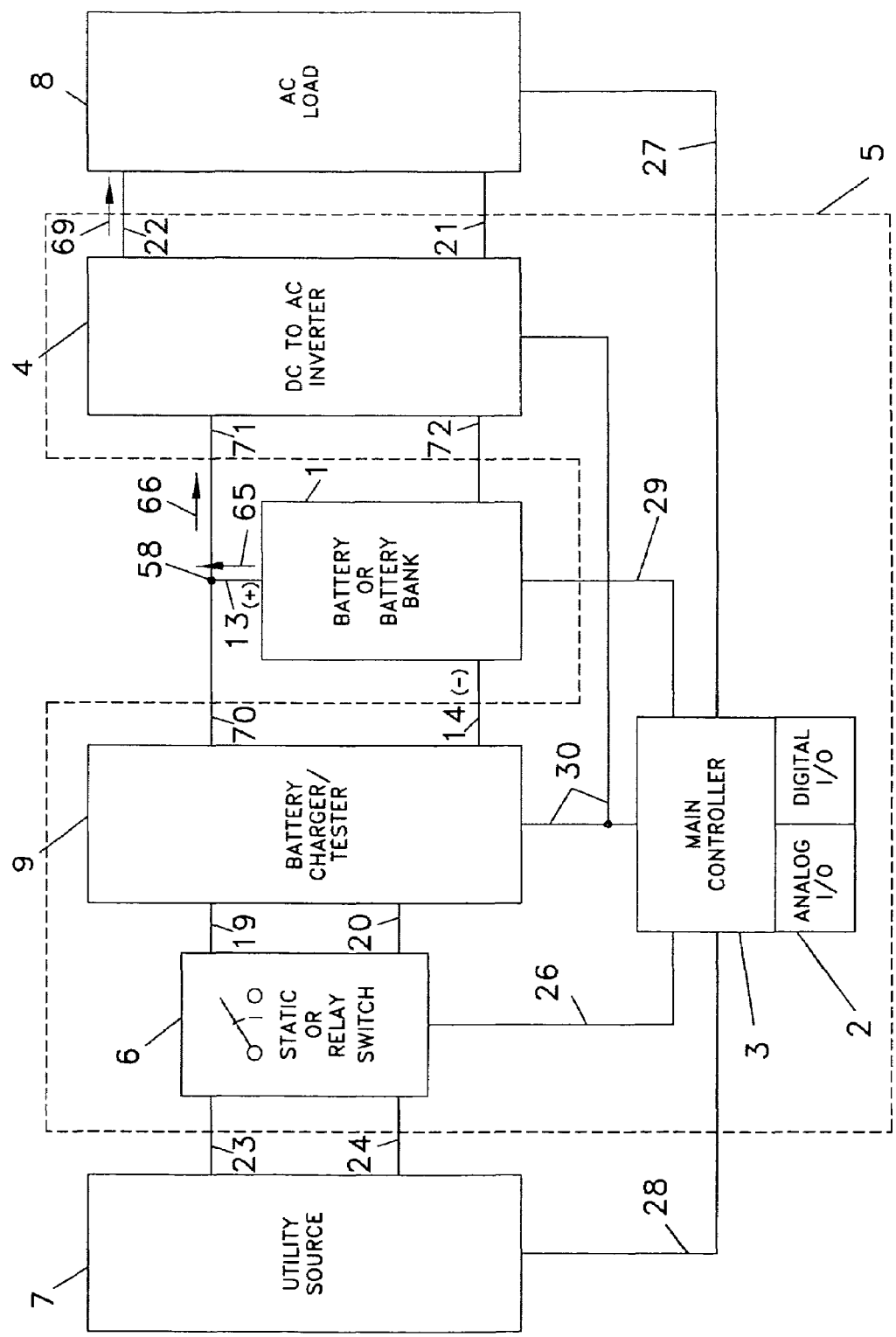
FIGURE 3D ON LINE (DOUBLE CONVERSION) UPS-AC LOAD BATTERY BACKUP MODE

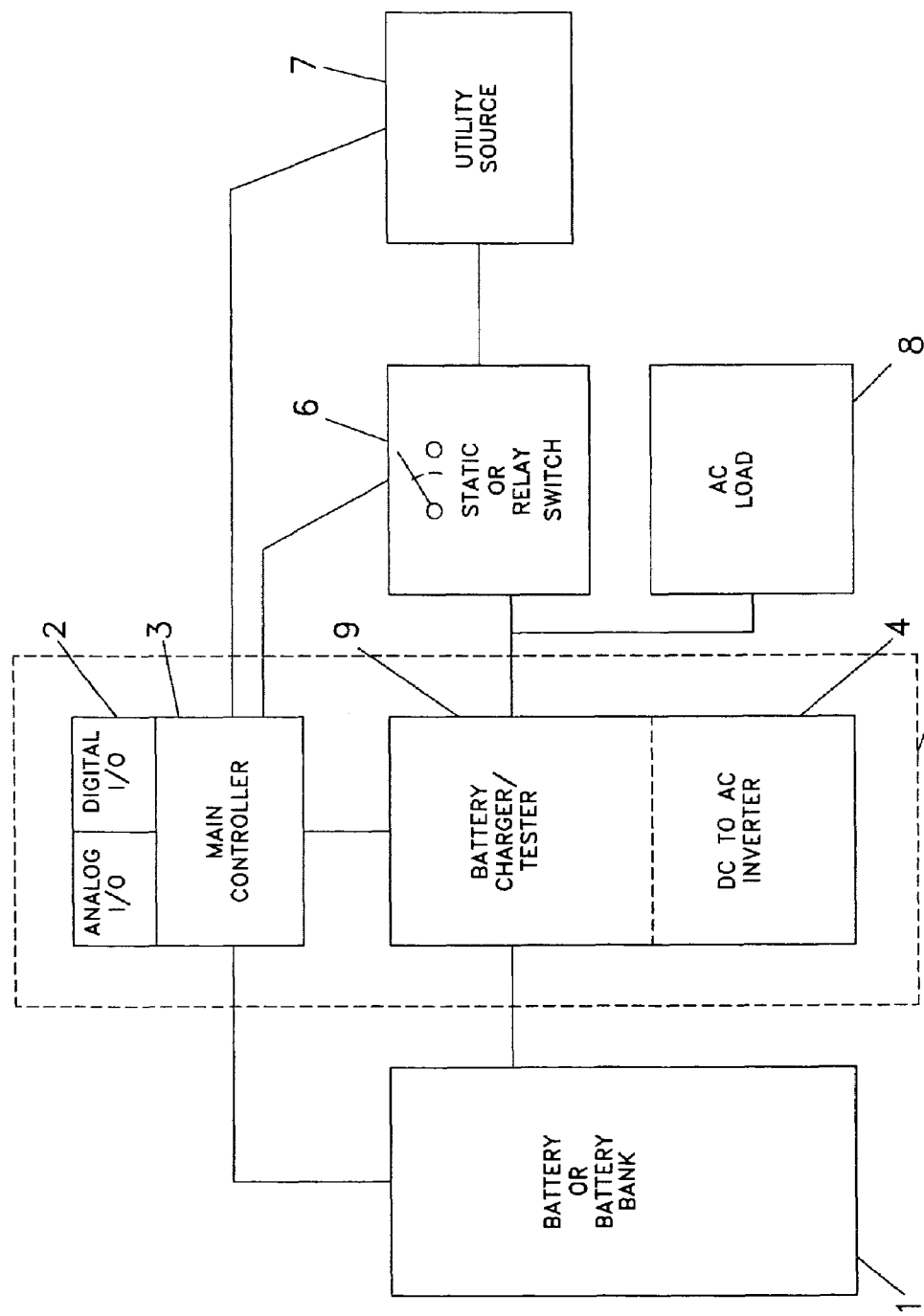

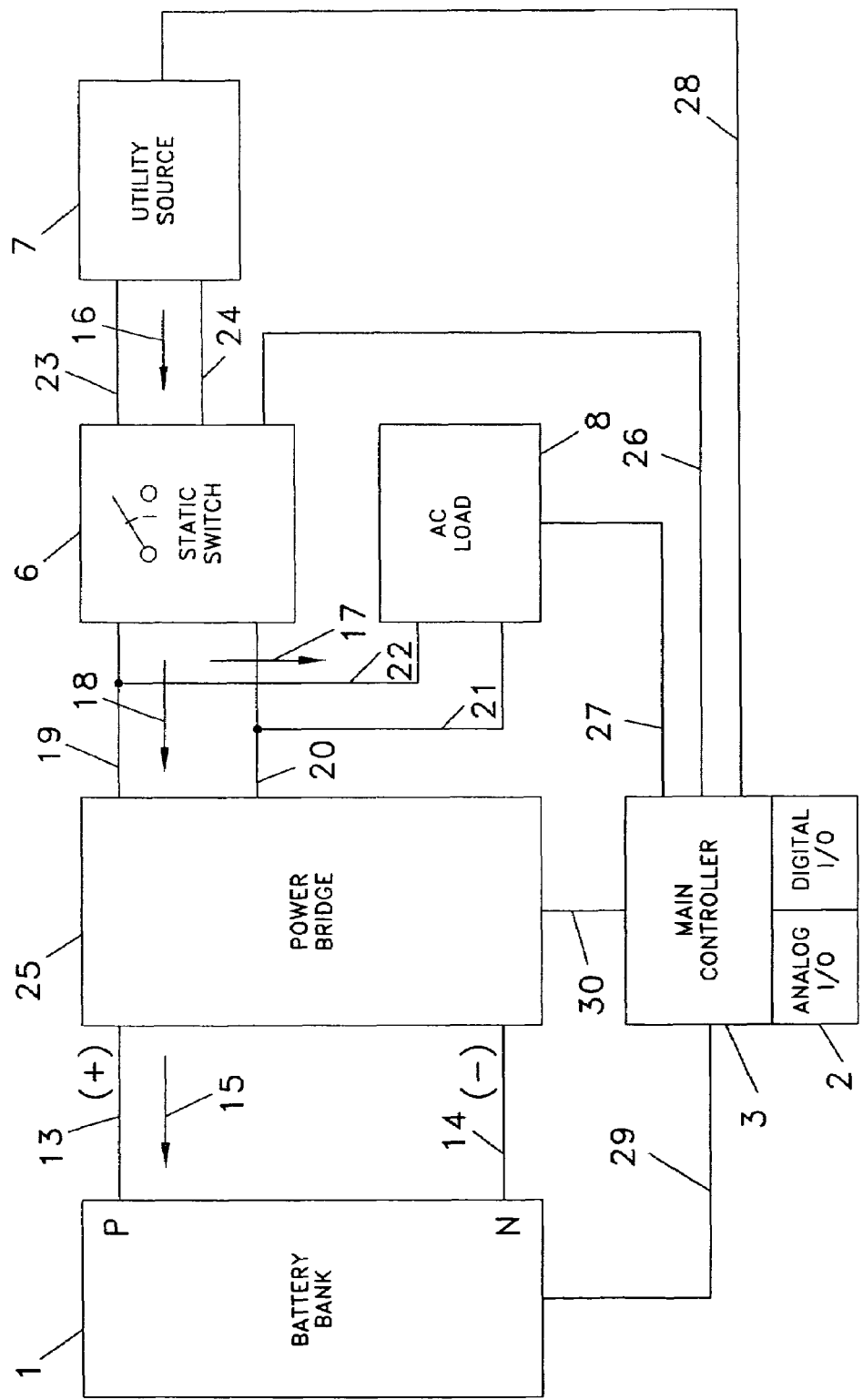
FIGURE 4B MODE 1 BATTERY CHARGING MODE

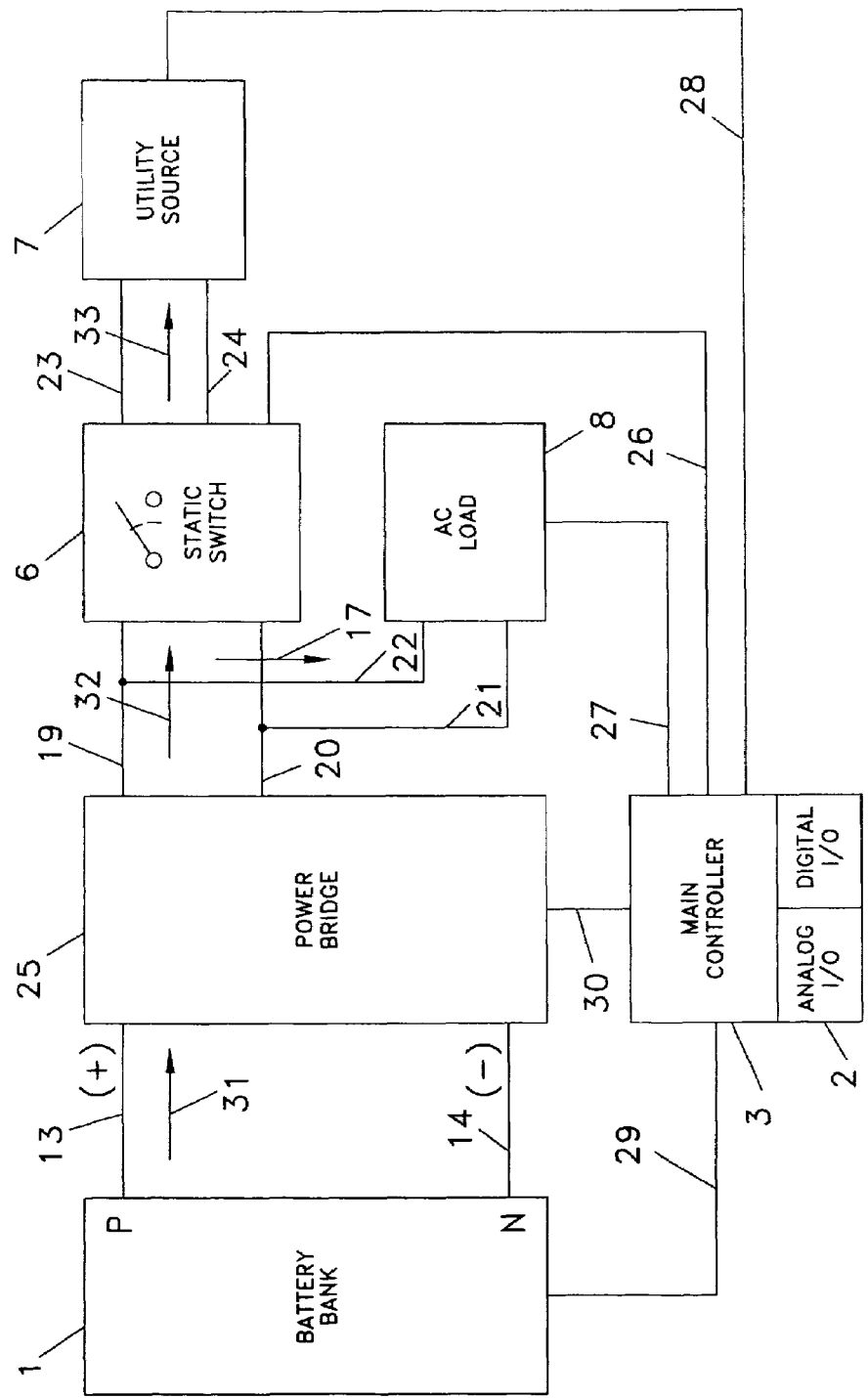
FIGURE 4C MODE 2 BATTERY TESTING MODE

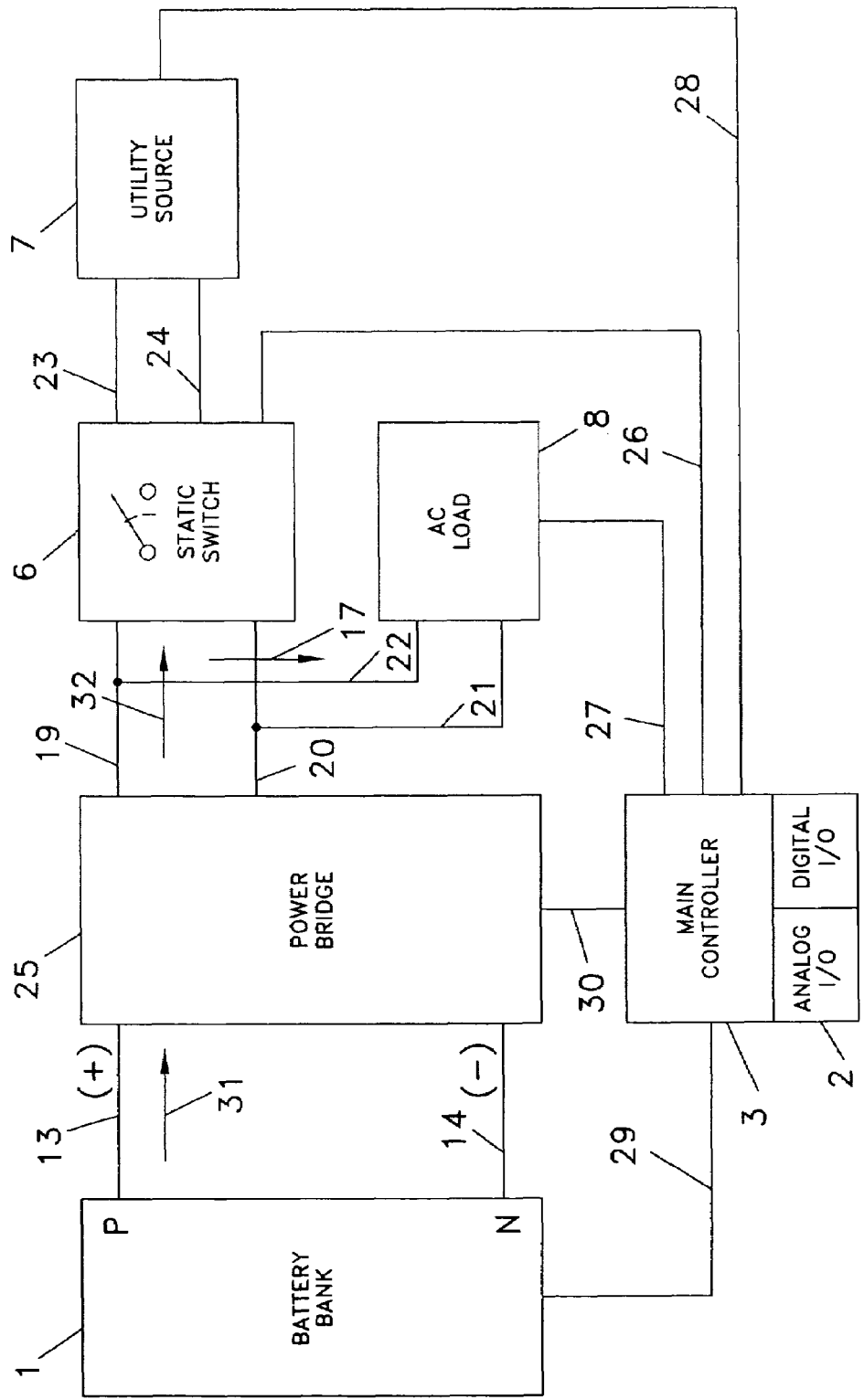
FIGURE 4D MODE 3 BATTERY BACKUP MODE

BATTERY TESTING APPARATUS THAT CONTROLS A SWITCH TO ALLOW CURRENT TO FLOW FROM THE BATTERY TO A UTILITY POWER SOURCE

BACKGROUND OF THE INVENTION

An uninterruptible power supply hereafter referred to as UPS, is used to provide backup power to critical loads in an electrical system. It is of utmost importance that the health of the batteries is known so that in the event of a utility line failure the batteries can support the load for the designated period of time. Conventional electronic battery test systems use two different approaches to test the batteries. The first approach simulates a failure of the utility line, transfers the load to the UPS, and measures the battery parameters. This approach risks the possibility that the load will not be supported when the test is initialized. A second approach utilizes additional contactors that switch load resistors across the batteries when a test is initialized. This approach adds cost, complexity, and the resistor loss becomes unmanageable for large systems. An electronic battery test system is disclosed that will illustrate a simple, low cost, method for testing the batteries under load without risking the capability to support the load at any time during the test. The system is comprised of a battery charger, batteries, and an inverter with a control system. The system is for use with a utility line, and load. This invention can be used in any system that contains a battery charger operated from an AC utility source that is directed in determining the health of a battery without compromising the back-up capability of the system.

Many applications require UPS systems to back up critical loads. There are different ways to ensure that the load will be supported in case of a utility line failure. Two common topologies used in the industry are the double conversion topology and the off line topology. The double conversion topology has a separate battery charger that operates from the AC line connected to the batteries and a separate output source that supplies the battery power to the loads. The output source could convert the battery to an AC output or a DC output. Off-line systems use the same inverter to either charge the batteries or support the load. When power from the utility line is present then it is passed to the load and the batteries are charged through the inverter. When the utility line fails the inverter switches from battery charging mode to inverting mode and the load is supplied by the batteries via the inverter.

Prior art methods have the following disadvantages with respect to battery testing. Some methods require batteries to be taken out of service, which risks that the load will not be supported in the event of an AC line failure. Other methods simulate a utility line failure and transfer to inverter to support the load; however, this poses a risk that the load is not supported if a battery has failed since the last test. Other methods of testing batteries require extra controllers, power switches to disconnect and reconnect the batteries, and a separate load that is large, costly, and inefficient for larger systems.

The present invention addresses the aforementioned limitations of the prior art by providing an apparatus and method that offers manual or programmable test features under micro-controller supervision that does not risk the load being dropped during the testing period. The battery test is performed by drawing a current from the battery and supplying that current into the utility grid. During the testing period battery parameters are monitored, tests results are saved, and alarms are generated based on historical data predicting battery degradation or weakness. The live circuit battery tester uses all common hardware with the battery charger and does not require additional disconnects or load banks.

SUMMARY OF THE INVENTION

It is an object of the present invention to illustrate an in circuit battery tester that could be an integral part of any battery charger or uninterruptible power supply (UPS) system having a battery string with any battery voltage and capacity.

Another aspect of the present invention allows the battery testing to be performed without disconnection of the load or the risk of not supporting the loads before, during, or after the testing occurs.

Yet another object of the present invention is to provide a control system for monitoring, collecting, and storing measured data. This data is used to determine weakening, failed, or poor connections in the battery system.

A further object of the present invention is to use the stored data to form a historical database to provide information about the degradation of the battery system over time.

This invention provides an arrangement for testing a battery connected to a battery charger and with the capability to support a critical load. Although this invention can be used on many different topologies, for clarification purposes an off-line UPS topology is chosen to illustrate the invention. The control for the UPS is comprised of three modes of operation: battery charging, battery backup, and battery testing. In an off-line topology, the AC utility source is connected or disconnected to the load via a static switch. The control will phase lock to the AC utility source, pass the source to the load, and charge the batteries by regulating the charging current to the batteries. The second control mode is activated when the utility line reaches an out of tolerance condition. The control will disconnect the AC utility source, instantaneously switch from battery charging mode to battery back-up mode and the load is supported by the battery through the inverter. The third control mode, battery testing, is activated by a user command or automatically by a pre-programmed set point in the control. Prior to entering battery test mode, three conditions must exist before the control will allow a transition from battery charging mode to battery test mode. The first condition is that the control mode must be in battery charging mode when the command is issued. The second condition is that the batteries must be at 100% capacity as calculated by the control and the third condition is that the battery has been at 100% capacity for a specified interval that is programmable. During battery test mode the control remains phase locked to the AC utility source, ramps down the battery charging current, begins to draw power from the batteries, and exports the power to the utility line. Throughout the battery test period the utility line is continuously monitored and never disconnected from the load so there is no possibility of load disruption. If the utility line fails during the battery test the control can instantaneously switch from battery test mode to battery back-up mode, abandoning battery test mode and providing full support to the load.

The invention further utilizes the capacity of software systems to measure in circuit, under load, battery parameters including: individual battery cell voltages, battery string currents, and battery temperatures. The analysis of the data will provide a direct correlation to the health of the batteries during this test. This information is stored and adds to a historical trend of test results that predicts weaknesses arising in the battery system over a longer period.

As will be clear to a person of ordinary skill in the art, the present invention provides a useful method for battery testing to determine a weakened or bad storage battery on which a system relies, without compromising backup operation of the system by allowing power to be drawn from the storage battery and supplied to the utility line without disconnecting the load from the utility source. During the testing, discharge parameters are measured and compared to historical data to determine weakened or bad batteries, and annunciations are provided to make the user aware of potential problems with the storage battery system. The present invention uses the same hardware to perform battery charging, battery testing, and battery backup, and an inverter function if required. The battery tester phase locks to the utility source, removes power from the storage battery, and routes the power into the utility line for a specified period of time. When the battery test is complete the system resumes charging the batteries.

According to the present invention, a battery test includes drawing a fixed load from the batteries over a specified length of time. Storage battery parameters are measured initially, during, and at the end of the test. These parameters are per unitized and compared to historical data. Historical data can be initial test data as well as the last 100 tests, and every $100^{th}$ test. The historical data is compared against threshold values to determine a weakened or failed battery. Alarms or faults are created to identify a problem with the battery system. These alarms and faults are transmitted via a display panel, digital I/O, or through a communication port.

BRIEF DESCRIPTION OF THE DRAWINGS

The following diagrams, where like elements are denoted by the same reference, coupled with the preferred embodiments will provide a better understanding of the invention itself.

FIG. 1A is a simplified block diagram of the elementary topology of the battery charger/tester.

FIG. 1B is a block diagram of the battery charger/tester during battery charging mode illustrating power flow direction.

FIG. 1C is a block diagram of the battery charger/tester during battery testing mode illustrating power flow direction.

FIG. 2A is a simplified block diagram of a DC Load UPS topology with the built in electronic battery tester.

FIG. 2B is a block diagram of a DC Load UPS topology during battery charging mode illustrating power flow direction.

FIG. 2C is a block diagram of a DC Load UPS topology during battery testing mode illustrating power flow direction.

FIG. 2D is a block diagram of a DC Load UPS topology during battery backup mode illustrating power flow direction.

FIG. 3A is a simplified block diagram of a double conversion AC UPS topology with a built in electronic battery tester.

FIG. 3B is a block diagram of a double conversion AC load UPS topology during battery charging mode illustrating power flow direction.

FIG. 3C is a block diagram of a double conversion AC load topology during battery testing mode illustrating power flow direction.

FIG. 3D is a block diagram of a double conversion AC load UPS topology during battery backup mode illustrating power flow direction.

FIG. 4A is a simplified block diagram of an off line AC UPS topology with the built in electronic battery tester.

FIG. 4B is a block diagram of an off line topology during battery charging mode illustrating power flow direction.

FIG. 4C is a block diagram of an off line topology during battery testing mode illustrating power flow direction.

FIG. 4D is a block diagram of an off line topology during battery backup mode illustrating power flow direction.

Figure 5A:
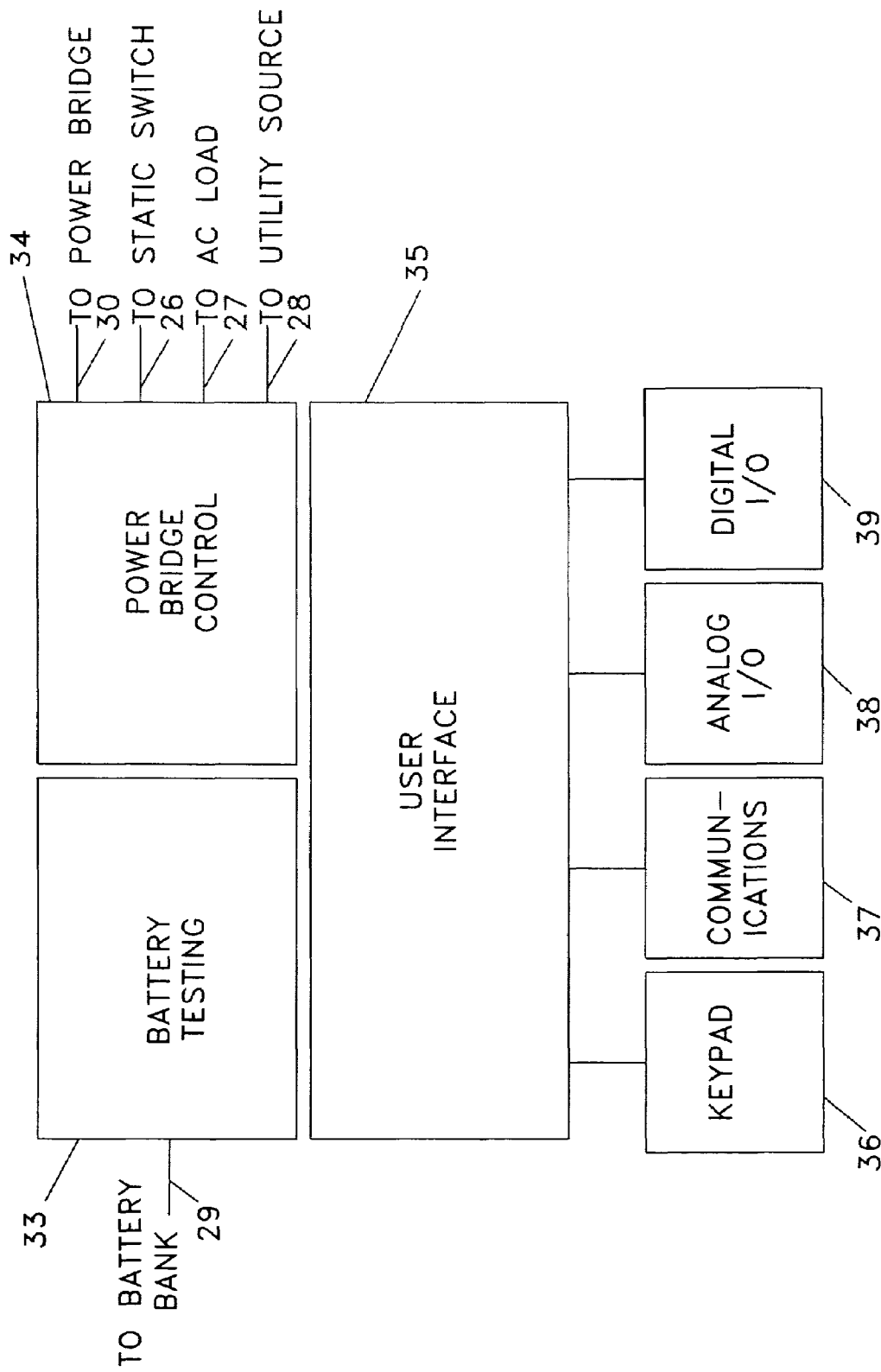
FIG. 5A is a block diagram illustrating the functions that exist in the main controller.

The figures illustrate some of the many different topologies for which the principals of the present invention apply. Specifically single phase topologies are discussed and shown but three phase systems apply exactly the same principles.

DETAILED DESCRIPTION OF PREFERRED EMBODIMENTS OF THE INVENTION

While the following examples illustrate some of the topologies that this patent applies to, it is not intended to describe all of the possibilities.

FIG. 1A, represents the simplest form factor of the present invention with an integral, in circuit, electronic battery testing section 11. The battery testing section 11 includes: a battery charger/tester 9, a controller 12, and a static switch or relay 6. The battery testing section 11 is connected between a battery or battery bank 1 and a utility source 7. The electronic battery testing section 11 includes two modes of operation: battery charging mode and battery testing mode. The mode of operation is determined and can be changed by the main controller 3 based on status signals fed back from the utility source 7, the analog/digital IO 2, and the battery bank 1. The analog/digital I/O 2 is the communication line to the user that allows transmission of information about the testing as well as reception of commands that execute functions related to the operation of the system. The analog and digital I/O suite includes dry contacts, lights, display panel with keypad, and communication ports (RS-232, Ethernet, TCIP, etc.).

FIG. 1B represents a simplified connection diagram for battery charging mode (mode 1). The battery charging mode is the normal operating mode for the battery charger/tester topology. The static switch 6 is a bi-directional switch that allows current to flow in either direction when closed and no current to flow when it is open. The function of the static switch 6 is two-fold; first and foremost it prevents the battery charger/tester 9 from supplying power to the utility source 7 when the utility source 7 is not present, i.e., when there is no utility voltage. Secondly, it allows a means to connect and disconnect the utility source 7 under certain conditions. These conditions, monitored by the main controller 3, include: whether the voltage is in tolerance, whether the frequency is in tolerance, whether the main controller 3 is phase locked to the utility source 7, and whether the utility has remained stable for a specified length of time. Phase lock describes a condition that exists when the main controller's simulated sine wave reference is in phase with the utility source's voltage waveform. Once phase lock is commanded the main controller 3 adjusts its natural oscillator frequency until it meets the frequency of the utility source 7 and remains locked on the frequency of the utility source 7 until the voltage or frequency of the utility source drifts out of tolerance.

Once the main controller 3 confirms that all conditions are satisfied, the main controller 3 closes the static switch 6. Once the static switch 6 is closed the battery charger/tester 9 has the utility source 7 available to charge the battery bank 1 through power lines 19, 20, 23, and 24. The battery bank 1 is connected to the battery charger/tester 9 via a positive connection 13 and a negative connection 14. The battery charger/tester 9 receives commands from the main controller 3 through control lines 30 and, in mode 1, is responsible transforming the AC current from the utility source 7 through the static switch 6 via power lines 23 and 24, to the battery charger/tester 9 through power lines 19 and 20 and to DC current required by the battery bank 1.

A summary of the events during battery charging mode is as follows: the main controller 3 senses the utility source 7 via control signals 28 and phase locks to the incoming utility source 7. Once phase lock is established and maintained, the main controller 3 closes the static switch 6 through control lines 26 providing power from the utility source 7 to the battery charger/tester 9. The main controller 3 then begins to switch the battery charger tester 9 via control lines 30 drawing current from the utility source 7 and supplying current to the battery bank 1. During this charging process, the main controller 3 monitors the battery bank through control sense lines 29 to regulate and monitor the charging event.

The arrows denoted by 47, 48, and 49 describe the current flow at one particular instant of time. During battery charging mode the current will flow from the utility source 7 to the battery charger/tester 9 through the static switch 6 via path 47 and 48. The battery charger/tester will transform the current and charge the battery bank 1 via path 49.

FIG. 1C represents a simplified connection diagram for battery testing mode (mode 2). Battery testing mode will draw power from the battery bank 1 and direct it into the utility source 7. In order to perform this function the main controller 3 must be phase locked to the utility source 7, just as in battery charging mode. Once phase locked, the main controller 3 produces a current reference and switches the battery charger tester 9 so that current is drawn from the battery bank 1 and directed to the utility source 7. This method of testing has the following advantages: First, by controlling the power flow into the utility source 7, a consistently repeatable power draw from the battery will occur reducing the error in detection of a weakened battery. This stems from the fact that batteries have a large set of independent variables that affect the state of battery health, one of which is load draw. If tests are performed at different loads, varying curves, e.g., voltage vs. time curves, will be produced making the determination of a weakened battery difficult. For example, if two tests are performed and the load draw on the battery during the second test is different than the load draw on the battery during the first test, two different curves will result. This inconsistency in load draw from test to test causes a corresponding inconsistency in test results. However, by providing the consistent load draw from the battery into utility source, the present invention eliminates this inconsistency in the test results. Second, this method of testing uses the same hardware for the battery testing and battery charging modes. Thus, the required components are reduced because a separate power bridge is not required for battery charging, battery testing, and battery back-up, rather only one power bridge is needed for all three modes. Moreover, by utilizing the same main controller 3 for battery testing, battery charging, and battery backup modes, the speed of response from one mode to another is extremely fast.

Before attempting to switch to battery testing mode, the main controller 3 ensures the following three conditions exist. First, battery charging mode (mode 1) is the mode of operation. Second, the calculated battery capacity is 100%. Battery capacity is defined as the percent of charge remaining in the battery. The main controller 3 calculates the charge into and out of the battery bank 1 via control line 29 and increases the battery capacity during charging mode (mode 1). Third, after the battery has reached 100% capacity, a timer is started and once the specified interval, that is programmable from 12 hr to 48 hrs, is exhausted battery testing mode can be activated. If the main controller 3 detects an out of tolerance condition on the utility source 7 through control lines 28 it will abort battery testing, mode 2, and instantaneously disconnect from the utility source 7. This set of rules enforced by the main controller 3 ensures that the testing begins from the same conditions each time; a fully charged battery bank.

Prior to entering battery testing mode (mode 2) all of the aforementioned states for battery charging mode apply and the main controller 3 is in battery charging mode (mode 1). A command to enter battery testing mode is received by the main controller 3 from one of the following means; analog I/O 2, digital I/O 2, or the main controller 3 itself. Once a command is received, the main controller 3 reduces the battery charging current to zero and starts to ramp up the current command slowly in the reverse direction until the desired set point is reached. By reversing the command, current will begin flowing from the battery 1 through the battery charger/tester 9 via power lines 13 and 14. The current will enter the static switch 6 via power lines 19 and 20 and supply the current into the utility source 7 by means of power lines 23 and 24.

The arrows denoted by 50, 51, and 52 describe the current flow at one particular instant of time. During battery testing mode the current will flow from the battery 1 through the battery charger/tester 9 through path 50 and from the battery charger/tester 9 to the static switch 6 via path 51. The current will pass through the static switch 6 and into the utility source 7 via path 52.

FIG. 2A, represents a DC Load UPS with an integral, in circuit, electronic battery testing section 11. The battery testing section 11 includes: a battery charger/tester 9, a controller 3, and a static switch or relay 6. Section 11 is mechanical, electrical, and functional identical to FIG. 1A. The main difference between the simple battery charger/tester and the DC Load UPS is the presence of a DC Load.

FIG. 2B is a simplified block diagram of the DC Load UPS showing the current flow in battery charging mode. The description and function of battery charging mode is exactly the same as the case for FIG. 1B into the battery charger/tester 9. A load node 58 was added to simplify the understanding of current flow in the different modes of operation of the DC Load UPS. The sum of the current flow into and out of the load node 58 must always equal zero.

A summary of the events during battery charging mode is as follows: the main controller 3 senses the utility source 7 via control signals 28 and phase locks to the incoming utility source 7. Once phase lock is established and maintained, the main controller 3 closes the static switch 6 through control lines 26 providing power from the utility source 7 to the battery charger/tester 9. The main controller 3 then begins to switch the battery charger tester 9 via control lines 30 drawing current from the utility source 7 and supplying current to the battery bank 1 as well as the required current for the DC Load 73. During this charging process, the main controller 3 monitors the battery bank through control sense lines 29 to regulate and monitor the charging event.

The arrows denoted by 54, 55, 56, 57, and 59 describe the current flow at one particular instant of time. During battery charging mode the current will flow from the utility source 7 to the battery charger/tester 9 through the static switch 6 via path 54 and 55. The battery charger/tester will transform the current and charge the battery bank 1 via path 56 into the load node 58. The load will demand a certain portion of that current flowing through path 59 to the load. The remainder of the current will charge the battery bank via path 57.

FIG. 2C is a block diagram showing the current flow, during battery testing mode, for a DC Load UPS. Battery testing mode requires all of the same conditions previously described for FIG. 1C. The main difference is the presence of a DC Load 73 which requires continuous power during transitions between modes. The current flow into the load node 58 from the battery 1 via path 63 is monitored via control lines 29. Once the main controller 12 begins switching the battery charger/tester 9, the current into the load node 58 is regulated to a predetermined set point. The current fed into the battery charger/tester 9 via path 62 is the excess current not required by the DC Load 73. This ensures the current draw from the battery bank 1 is repeatable each test. The dc current is switched into ac current by the battery charger/tester 9 and sent through the static switch via path 61. During this mode the static switch is closed allowing the current to flow into the utility line via path 60.

FIG. 2D represents a simplified connection diagram for battery backup mode (mode 3). The main controller 3 switches to battery backup mode any time the utility source is out of tolerance. The main controller 3 must be able to switch to this mode extremely quickly from any other mode to ensure the load is fully supported. The present invention enables extremely fast transfer times between any two modes of operation while always ensuring that the DC load 73 is supported at all times. In the case of a DC Load, quick transfer times are realized because there are no devices between the battery 1 and the dc load 73 to interrupt current flow. Once battery backup mode (mode 3) is entered battery testing mode (mode 2) is disabled. In battery backup mode current is supplied, via lines 65 and 66, from the battery bank 1 to dc load 73 through power lines 71 and 72. In this mode of operation the main controller opens the static switch 6 through control lines 26 so no power can be back fed to the utility source 7 or from the utility source 7 to the DC load. Once the utility source 7 is within tolerance for a specified period of time the main controller 3 will phase lock to the utility source 7 and close the static switch 6. At this instant the main controller 3 switches from mode 3, battery backup mode, to mode 1, battery charging mode.

FIG. 3A, represents an on line double conversion ups with an integral, in circuit, electronic battery testing section 5. The UPS 74 consists of a battery charger/tester 9, a controller 3, a static switch or relay 6, and a dc-ac inverter 4. The operation of the battery charging/testing part of the system that includes the battery charger/tester 9, the static switch 6, and the main controller 3 function identically to the DC Load UPS, FIG. 2A, as previously described. With the addition of an AC load, a dc/ac inverter power section 4 is required to invert the batteries dc voltage to an ac voltage to support the AC load 8.

FIG. 3B is a simplified block diagram of the on line double conversion UPS showing the current flow in battery charging mode. The description and function of battery charging mode is exactly the same as the case for FIG. 2B into the battery charger/tester 9. Just as in the case of the Dc Load UPS the sum of the current flow into and out of the load node 58 must always equal zero.

A summary of the events during battery charging mode is as follows: the main controller 3 senses the utility source 7 via control signals 28 and phase locks to the incoming utility source 7. Once phase lock is established and maintained, the main controller 3 closes the static switch 6 through control lines 26 providing power from the utility source 7 to the battery charger/tester 9. The main controller 3 then begins to switch the battery charger tester 9 via control lines 30 drawing current from the utility source 7 and supplying current to the battery bank 1 as well as the required current for the dc to ac inverter 4. The main controller 3 will switch the dc/ac inverter 4 via control lines 30 to produce an ac voltage that will supply the ac load 8. During this charging process, the main controller 3 monitors the battery bank through control sense lines 29 to regulate and monitor the charging event.

The arrows denoted by 54, 55, 56, 57, 59 and 67 describe the current flow at one particular instant of time. During battery charging mode the current will flow from the utility source 7 to the battery charger/tester 9 through the static switch 6 via path 54 and 55. The battery charger/tester will transform the current and charge the battery bank 1 via path 56 into the load node 58. The dc to ac inverter 4 will demand a certain portion of that current flowing through path 59 to supply the ac load 8 via path 67. The remainder of the current will charge the battery bank via path 57.

FIG. 3C is a block diagram showing the current flow, during battery testing mode, for an on line double conversion UPS. Battery testing mode requires all of the same conditions previously described for FIG. 2C. The main difference is the current flow out of the load node 58 from the battery 1 via path 64 feeds a dc-ac inverter 4 versus a dc load. Once the main controller 3 begins switching the battery charger/tester 9, the current into the load node 58 is regulated to a predetermined set point. The current fed into the battery charger/tester 9 via path 62 is the excess current not required by the dc/ac inverter 4. This ensures the current draw from the battery bank 1 is repeatable each test. The dc current is switched into ac current by the battery charger/tester 9 and sent through the static switch via path 61. During this mode the static switch is closed allowing the current to flow into the utility line via path 60.

FIG. 3D represents a simplified connection diagram for battery backup mode (mode 3). The main controller 3 switches to battery backup mode any time the utility source is out of tolerance. The main controller 3 must be able to switch to this mode extremely quickly from any other mode to ensure the load is fully supported. The present invention enables extremely fast transfer times between any two modes of operation while always ensuring that the AC load 8 is supported at all times. Once battery backup mode (mode 3) is entered battery testing mode (mode 2) is disabled. In battery backup mode current is supplied, via lines 65 and 66, from the battery bank 1 to dc/ac inverter 4 through power lines 71 and 72. In this mode of operation the main controller opens the static switch 6 through control lines 26 so no power can be back fed to the utility source 7 or from the utility source 7 to the AC load. Once the utility source 7 is within tolerance for a specified period of the time the main controller 3 will phase lock to the utility source 7 and close the static switch 6. At this instant the main controller 3 switches from mode 3, battery backup mode, to mode 1, battery charging mode.

FIG. 4A is a simplified block diagram of an off line UPS topology. This topology includes an electronic battery testing section 5 that includes: a battery charger/tester 9 and DC to AC inverter 4 connected to a battery bank 1. The static switch or relay 6 is the element that connects the utility source 7 to the AC load 8 and battery charger/tester 9/DC to AC inverter 4. The electronic battery testing section 5 includes three modes of operation: battery charging mode, battery testing mode, and DC to AC inverter mode (battery backup mode). The mode of operation is determined and can be changed by the main controller 3 based on status signals fed back from the utility source 7, the analog/digital IO 2, and the battery bank 1. The analog/digital I/O 2 is the communication line to the user that allows transmission of information about the testing as well as reception of commands that execute functions related to the operation of the system. The analog and digital I/O suite includes dry contacts, lights, display panel with keypad, and communication ports (RS-232, Ethernet, TCIP, etc.).

FIG. 4B represents a simplified connection diagram for battery charging mode (mode 1). For simplicity of discussion, the battery charger/tester 9, and DC to AC inverter 4 are illustrated in FIG. 2A generically as a power bridge 25. The battery charging mode is the normal operating mode for the off line UPS topology. In Mode 1 the utility source 7 charges the battery bank 1 as well as supports the AC load 8. The static switch 6 is a bi-directional switch that allows current to flow in either direction when closed and no current to flow when it is open. The function of the static switch 6 is two-fold; first and foremost it prevents the power bridge 25 from supplying power to the utility source 7 when the utility source 7 is not present, i.e., when there is no utility voltage. Secondly, it allows a means to connect and disconnect the utility source 7 under certain conditions. These conditions, monitored by the main controller 3, include: whether the voltage is in tolerance, whether the frequency is in tolerance, whether the main controller 3 is phase locked to the utility source 7, and whether the utility has remained stable for a specified length of time. Phase lock describes a condition that exists when the main controller's simulated sine wave reference is in phase with the utility source's voltage waveform. Once phase lock is commanded the main controller 3 adjusts its natural oscillator frequency until it meets the frequency of the utility source 7 and remains locked on the frequency of the utility source 7 until the voltage or frequency of the utility source drifts out of tolerance. Being phase locked to the utility source 7 is a very important condition that must exist before entering mode 1 to ensure continuous power supply to the load during transition between modes.

Once the main controller 3 confirms that all conditions are satisfied, the main controller 3 closes the static switch 6 so that the AC load 8 is immediately supplied from the utility source 7 through power lines 21, 22, 23, and 24. Once the static switch 6 is closed the power bridge 25 has the utility source 7 available to charge the battery bank 1. The battery bank 1 is connected to the power bridge 25 via a positive connection 13 and a negative connection 14. The power bridge 25 receives commands from the main controller 3 through control lines 30 and, in mode 1, is responsible transforming the AC current from the utility source 7 through the static switch 6 via power lines 23 and 24, to the power bridge 25 through power lines 19 and 20 and to DC current required by the battery bank 1.

A summary of the events during battery charging mode is as follows: the main controller 3 senses the utility source 7 via control signals 28 and phase locks to the incoming utility source 7. Once phase lock is established and maintained, the main controller 3 closes the static switch 6 through control lines 26 providing power from the utility source 7 through to the AC load 8. Sense lines 27 provide the main controller 3 with information about the load voltage and current. The power bridge then begins to switch drawing current from the utility source 7 and supplies current to the battery bank 1. During this charging process, the main controller 3 monitors the battery bank through control sense lines 29 to regulate and monitor the charging event.

The arrows denoted by 15, 16, 17, and 18 describe the current flow at one particular instant of time. During battery charging mode the current will flow from the utility source 7 to the AC load 8 through the static switch 6 via path 16 and 17 as well as from the utility source 7 through the static switch 6 via path 16 and 18 to the power bridge 25. The power bridge 25 will transform the current and charge the battery bank 1 via path 15.

FIG. 4C represents a simplified connection diagram for battery testing mode (mode 2). Battery testing mode will draw power from the battery bank 1 and direct it into the utility source 7. In order to perform this function the main controller 3 must be phase locked to the utility source 7, just as in battery charging mode. Once phase locked, the main controller 3 produces a current reference and switches the power bridge 25 so that current is drawn from the battery bank 1 and directed to the utility source 7. This method of testing has the following advantages: First, it does not risk losing power supply to the load if the utility line fails. Second, by controlling the power flow into the utility source 7, a consistently repeatable power draw from the battery will occur reducing the error in detection of a weakened battery. This stems from the fact that batteries have a large set of independent variables that affect the state of battery health, one of which is load draw. If tests are performed at different loads, varying curves, e.g., voltage vs. time curves, will be produced making the determination of a weakened battery difficult. For example, if two tests are performed and the load draw on the battery during the second test is different than the load draw on the battery during the first test, two different curves will result. This inconsistency in load draw from test to test causes a corresponding inconsistency in test results. However, by providing the consistent load draw from the battery into utility source, the present invention eliminates this inconsistency in the test results. Third, this method of testing uses the same hardware for the battery testing, battery charging, and battery backup modes. Thus, the required components are reduced because a separate power bridge is not required for battery charging, battery testing, and battery back-up, rather only one power bridge is needed for all three modes. Moreover, by utilizing the same main controller 3 for battery testing, battery charging, and battery backup modes, the speed of response from one mode to another is extremely fast.

Before attempting to switch to battery testing mode, the main controller 3 ensures the following three conditions exist. First, battery charging mode (mode 1) is the mode of operation. Second, the calculated battery capacity is 100%. Battery capacity is defined as the percent of charge remaining in the battery. The main controller 3 calculates the charge into and out of the battery bank 1 via control line 29 and increases the battery capacity during charging mode (mode 1) or decreases the battery capacity during battery backup mode (mode 3). Third, after the battery has reached 100% capacity, a timer is started and once the specified interval, that is programmable from 12 hr to 48 hrs, is exhausted battery testing mode can be activated. If the main controller 3 detects an out of tolerance condition on the utility source 7 through control lines 28 it will abort battery testing, mode 2, and instantaneously switch to battery backup, mode 3. This set of rules enforced by the main controller 3 ensures that there is no disruption to the AC load 8 due to battery testing command and that the testing begins from the same conditions each time; a fully charged battery bank.

Prior to entering battery testing mode (mode 2) all of the aforementioned states for battery charging mode apply and the main controller 3 is in battery charging mode (mode 1). A command to enter battery testing mode is received by the main controller 3 from one of the following means; analog I/O 2, digital I/O 2, or the main controller 3 itself. Once a command is received, the main controller 3 reduces the battery charging current to zero and starts to ramp up the current command slowly in the reverse direction until the desired set point is reached. By reversing the command, current will begin flowing from the battery 1 through the power bridge 25 via power lines 13 and 14. The current will enter the static switch 6 via power lines 19 and 20 and supply the current to the AC load 8 through power lines 21 and 22. Once the power exceeds the AC load's 8 requirement, the excess will be exported to the utility source 7 by means of power lines 23 and 24.

The arrows denoted by 31, 32, 33, and 17 describe the current flow at one particular instant of time. During battery testing mode the current will flow from the battery 1 through the power bridge 25 through path 31 and from the power bridge 25 to the static switch 6 via path 32. In this example the current is larger than the AC load 8 requires, so the AC load 8 will consume the current it requires through path 17 and the remainder will be exported to the utility source 7 via path 33.

FIG. 4D represents a simplified connection diagram for battery backup mode (mode 3). The main controller 3 switches to battery backup mode any time the utility source is out of tolerance. The main controller 3 must be able to switch to this mode extremely quickly from any other mode to ensure the load is fully supported. The present invention enables extremely fast transfer times between any two modes of operation while always ensuring that the AC load is supported at all times. Such quick transfer times are realized because the same hardware (battery bank 1, power bridge 25, static switch 6, and main controller 3) is used for all three modes of operation. Once battery backup mode (mode 3) is entered battery testing mode (mode 2) is disabled. In battery backup mode power is supplied from the battery bank 1 to the power bridge 25 through power lines 13 and 14. The power bridge will invert the DC voltage to an AC voltage at the proper amplitude and frequency. Required power is supplied to the AC load 8 via power lines 19 and 20. In this mode of operation the main controller opens the static switch 6 through control lines 26 so no power can be back fed to the utility source 7 or from the utility source 7 to the AC load. Once the utility source 7 is within tolerance for a specified period of the time the main controller 3 will phase lock to the utility source 7 and close the static switch 6 allowing the AC load 8 to become supported by the utility source 7. At this instant the main controller 3 switches from mode 3, battery backup mode, to mode 1, battery charging mode.

FIG. 5A is a block diagram of the functions within the main controller 3. From a high level view, the main controller 3 can be divided into three major functions: Battery testing 33, power bridge control 34, and user interface control 35.

The battery testing 33 section of the controller is responsible for the following functions: measuring the battery parameters through feedback sensing line 29, per unitizing the calculations (so direct comparisons can be correlated), comparing the results to predefined set points, initiating alarms based on the results indicating weakened or failed batteries, and management of the test information over many test cycles.

The power bridge control 34 is tasked to ensure the proper mode is activated, control the gating commands for all power devices in the bridge, process feedback signals, and manage all of the regulating loops.

The user interface 35 receives its commands from I/O and sends the information to the main controller for processing. The data can come from analog I/O 38, digital I/O 39, a communications port that can be serial or parallel 37, or entered through a keypad 36.

Figure 5B:
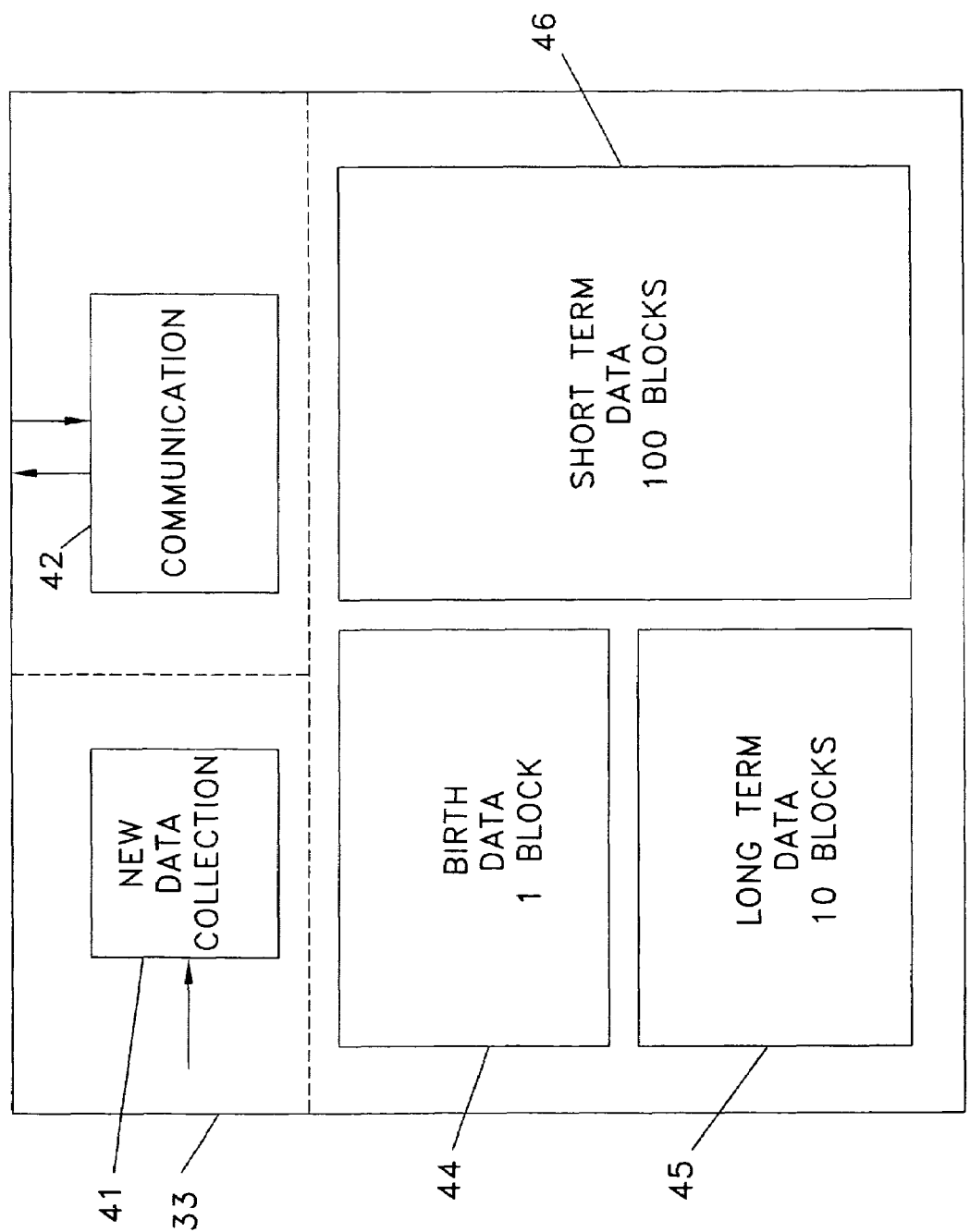
FIG. 5B is a block diagram illustrating the battery testing section of the main controller.

FIG. 5B illustrates the battery testing portion 33 of the main controller 3, which can be further reduced into three categories of functions: new data collection 41, communication 42, and memory map 44, 45, and 46. The communication section 42, of the battery testing block 33, is used to transmit information to and from the main controller 3. Alarms, faults, status of the test is the type of information that is passed to the main controller 3 and when a test will be performed, how long the test will be performed, how much load to draw from the battery is the type of information that is passed from the main controller 3. The data collection block 41 measures the battery parameters and per unitizes the information for correlation. The battery parameters measured are voltage, temperature, and current. The battery current sensor is used to ensure the load draw on the battery is consistent. The battery voltages are used to determine the pass or fail criteria following the execution of a battery test. Temperature sensing allows a correction on the battery capacity calculation to improve the repeatability of the tests through varying environmental conditions.

Correlation is vital to the success of predicting when a battery is weakening and this invention minimizes three of the parameters that cause the widest variation in the margin of error in the prior art systems. First, the main controller 3 will ensure the battery capacity is at 100% for a significant period of time before the test will be executed. This requirement ensures the battery is at a fully charged state, if possible, at the beginning of the battery test. Second, the test method allows for the same exact load draw on each battery test performed. This is accomplished by being able to use the utility source 7 as an infinite current sink so if AC load 8 draw is not enough to load the battery to the desired set point, the remaining load draw required can be exported to the utility source 7. Third, the temperature data is used to compensate the battery capacity calculation so if a test is performed at a colder or hotter temperature the result is the same as if it were performed at a base temperature. Finally, the method of determining a weakening battery is completely dependant on the past performance over time of that specific battery, which individualizes the data for each battery or battery bank and makes decisions based on the historical data for the specific battery or battery bank.

Three forms of historical information are stored for comparison. Birth data 44 is information stored at the initial commissioning of the system or any time a battery is replaced. Short term data 46 is the last 100 results of the battery test. Long term data 45 is the last result (the $100^{th}$ result of the short term data) prior to rewriting over location 1. Long term data is effectively test 100, 200, 300 etc. These numbers are exemplary and can be set according to the needs of the particular environment and the testing requirements.

When the UPS is initially installed the battery test is performed creating the birth data. This data is saved in a specified memory location as the initial data. This data will be retained in memory until the startup procedure is executed again, in the case that all batteries are changed, or each individual battery can be reset for the case that one battery is replaced.

A summary of the battery test mode is as follows: A command is received to perform the battery test and the main controller 3 determines that adequate time has elapsed to enable the battery bank 1 to be fully charged and the system is in the proper mode. The main controller 3 begins the battery test by decreasing the battery charging reference to zero and then proceeds to increase the battery testing current reference. The battery testing reference is increased until the desired load draw is reached as measured by the battery current sensor. The battery capacity begins to decrease as load is taken from the battery bank 1 and injected into the utility source 7. Once the battery capacity is decreased to 75% the battery test is complete. The interim measurements are used as a coarse determination of a failing battery. Battery voltages are collected at different intervals throughout the testing period. For example if the battery voltage is nominally 12V and after 1 second of testing the battery voltage drops to 8V then an alarm will be generated. Three comparisons are made with the newly generated data. First a comparison is made between the new test data and the stored test data resulting from the twenty-fifth prior test. If the results differ by 20% an alarm is generated. Next, the main controller 3 performs a comparison between the new test data and the most recent long term test data. If the results vary by more than 50% an alarm is generated. Finally a comparison of the new test data is made with the birth data and if the results vary more than 75% an alarm is generated. The data is stored in memory so that historical logs, time and date stamped, are kept for each of the tests. The memory will hold data for previous 100 consecutive tests before rewriting over the oldest data. The historical information is stored and can be exported to a database so a user can analyze and make determinations about possible weakening batteries through trending analysis.

The invention claimed is:

1. A battery testing apparatus for use with a battery and a utility power source, said battery testing device comprising:
    a battery charger/tester, to be connected to the battery, operable to selectively allow either: electrical current to flow to the battery through said battery charger/tester; or electrical current to flow from the battery through said battery charger/tester;
    a switch, connected to said battery charger/tester and to be connected to the utility power source, wherein when the switch is closed the utility power source and the battery charger/tester are electrically connected and when the switch is open the utility power source and the battery charger/tester are electrically disconnected;
    a controller electrically connected to said battery charger/tester and said switch via control lines, and to be electrically connected to the utility power source, and the battery via sense lines, and having a battery charge mode and a battery test mode, wherein:
        in the battery charge mode, said controller is operable to control said switch such that said switch is closed to electrically connect the utility power source to the battery charger/tester, and control said battery charger/tester to allow electrical current to flow from the utility power source to the battery; and
        in the battery test mode, said controller is operable to control said switch such that said switch is closed to electrically connect the utility power source to the battery charger/tester, control said battery charger/tester to allow current to flow from the battery to the utility power source via said switch, and to collect test data from the current flowing from the battery.

2. The apparatus of claim 1, wherein said controller is operable to change the mode of operation based on status signals on the sense lines from the utility source and the battery.

3. The apparatus of claim 1, wherein the battery comprises a battery bank.

4. The apparatus of claim 1, wherein:
    said controller is operable to monitor conditions via the sense lines; and
    the conditions include:
        whether the voltage being supplied from the utility power source is within a preset tolerance,
        whether the frequency of the electrical power being supplied from the utility power source is within a preset tolerance,
        whether said controller is able to phase lock to the utility source, and
        whether the power supplied from the utility power source has remained stable for a specified length of time.

5. The apparatus of claim 1, for use with a DC load, said apparatus further comprising:
    a load node connected to said battery charger/tester, wherein the battery charger/tester is to be connected to the battery via said load node, and said load node is to be connected to the DC load;
    said controller further including a battery backup mode, wherein in the battery backup mode, said controller is operable to control said switch such that said switch is open to electrically disconnect the utility power source from the battery charger/tester, and control said battery charger/tester to stop current from flowing through said battery charger/tester and allow electrical current to flow from the battery to the load node to provide battery backup to the load from the battery via said load node.

6. The apparatus of claim 5, wherein said controller is operable control said battery charger/tester and said switch to transition to any one of the battery testing, battery charging, and battery backup modes from any other of the battery testing, battery charging, and battery backup modes without interrupting power being supplied to the DC load.

7. The apparatus of claim 5, wherein said controller is operable to change the mode of operation based on status signals on the sense lines from the utility source and the battery.

8. The apparatus of claim 1, for use with an AC load, said apparatus further comprising:
    an inverter, connected to said controller via an inverter control line and to be connected between the battery and the AC load, operable to invert DC current from the battery into AC current for the AC load;
    said controller further including a battery backup mode, wherein in the battery backup mode, said controller is operable to control said switch such that said switch is open to electrically disconnect the utility power source from the battery charger/tester, and control said battery charger/tester to stop current from flowing through said battery charger/tester and to allow electrical current to flow from the battery to the inverter to provide battery backup to the load from the battery via said inverter.

9. The apparatus of claim 8, wherein said controller is operable control said battery charger/tester and said switch to transition to any one of the battery testing, battery charging, and battery backup modes from any other of the battery testing, battery charging, and battery backup modes without interrupting power being supplied to the AC load via said inverter.

10. The apparatus of claim 8, wherein said controller is operable to change the mode of operation based on status signals on the sense lines from the utility source and the battery.

11. A battery charging, battery testing, and battery backup apparatus for use with a battery, a utility power source, and a load, said apparatus comprising:
    a switch, to be connected to the load at a load node and to the utility power source, wherein when the switch is closed the load and the utility power source are electrically connected and when the switch is open the load and the utility power source are electrically disconnected;
    a power bridge, electrically connected to the switch at the load node, and to be electrically connected to the battery, operable to selectively allow electrical current to flow to the battery through said power bridge or allow electrical current to flow from the battery through said power bridge;
    a controller electrically connected to said power bridge and said switch via control lines, and to be electrically connected to the utility power source, the load, and the battery via sense lines, and having a battery charge mode, a battery test mode, and a battery backup mode, wherein:

in the battery charge mode, said controller is operable to control said switch such that said switch is closed to electrically connect the utility power source to the load node, and control said power bridge to allow electrical current to flow from the load node to the battery;

in the battery test mode, said controller is operable to control said switch such that said switch is closed to electrically connect the utility power source to the load node, control said power bridge to allow current to flow from the battery to the load node and to the utility power source via said switch, and to collect test data from the current flowing from the battery; and in the battery backup mode, said controller is operable to control said switch such that said switch is open to electrically disconnect the utility power source from the load node, and control said power bridge to allow electrical current to flow from the battery to the load node to provide battery backup to the load.

12. The apparatus of claim 11, wherein said controller is operable control said power bridge and said switch to transition to any one of the battery testing, battery charging, and battery backup modes from any other of the battery testing, battery charging, and battery backup modes without interrupting power being supplied to the load.

13. The apparatus of claim 11, wherein said controller is operable to change the mode of operation based on status signals on the sense lines from the utility source and the battery.

14. The apparatus of claim 11, wherein the battery comprises a battery bank.

15. The apparatus of claim 11, wherein:

said controller is operable to monitor conditions via the sense lines; and the conditions include:
whether the voltage being supplied from the utility power source is within a preset tolerance,
whether the frequency of the electrical power being supplied from the utility power source is within a preset tolerance,
whether said controller is able to phase lock to the utility source, and
whether the power supplied from the utility power source has remained stable for a specified length of time.

* * * * *